（12） United States Patent
Williamson et al.

(10) Patent No.: US 10,347,589 B2
(45) Date of Patent: Jul. 9, 2019

(54) SEMICONDUCTOR SUBSTRATE HAVING STRESS-ABSORBING SURFACE LAYER

(71) Applicant: TEXAS INSTRUMENTS INCORPORATED, Dallas, TX (US)

(72) Inventors: Jaimal M. Williamson, McKinney, TX (US); Nima Shahidi, Dallas, TX (US); Jose Carlos Arroyo, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/498,461

(22) Filed: Apr. 26, 2017

(65) Prior Publication Data

US 2017/0229405 A1    Aug. 10, 2017

Related U.S. Application Data

(62) Division of application No. 14/333,553, filed on Jul. 17, 2014, now Pat. No. 9,673,065.

(Continued)

(51) Int. Cl.
*H01L 23/48* (2006.01)
*H01L 21/00* (2006.01)
(Continued)

(52) U.S. Cl.
CPC .......... *H01L 23/562* (2013.01); *H01L 21/563* (2013.01); *H01L 23/295* (2013.01); *H01L 23/3135* (2013.01); *H01L 23/49816* (2013.01); *H01L 23/49838* (2013.01); *H01L 23/49894* (2013.01); *H01L 24/09* (2013.01); *H01L 24/14* (2013.01); *H01L 24/16* (2013.01); *H01L 24/17* (2013.01); *H01L 24/81* (2013.01); *H01L 2224/0401* (2013.01);
(Continued)

(58) Field of Classification Search
CPC ....... H01L 23/562; H01L 24/09; H01L 24/81; H01L 24/14; H01L 24/17; H01L 24/16; H01L 23/3135; H01L 23/49816; H01L 23/49838; H01L 23/295; H01L 21/563; H01L 23/49894
See application file for complete search history.

(56) References Cited

U.S. PATENT DOCUMENTS 6,774,497 B1 *   8/2004  Qi ................. H01L 21/563
                                                257/783
6,809,262 B1 * 10/2004  Hsu .............. H01L 23/49838
                                                174/558

(Continued)

*Primary Examiner* — Alonzo Chambliss
(74) *Attorney, Agent, or Firm* — Rose Alyssa Keagy; Charles A. Brill; Frank D. Cimino

(57) ABSTRACT

An assembly (101) comprising a semiconductor device (110) with solderable bumps (112); a substrate (120) with a layer (130) of a first insulating compound and an underlying metal layer (140) patterned in contact pads (141) and connecting traces (142), the insulating layer having openings (132) to expose the surface (142a) and sidewalls (142b) of underlying traces; the device bumps soldered onto the contact pads, establishing a gap (150) between device and top insulating layer; and a second insulating compound (160) cohesively filling the gap and the second openings, thereby touching the underlying traces, the second insulating compound having a higher glass transition temperature, a higher modulus, and a lower coefficient of thermal expansion than the first insulating compound.

13 Claims, 4 Drawing Sheets

Related U.S. Application Data

(60) Provisional application No. 61/847,631, filed on Jul. 18, 2013.

(51) Int. Cl.
  *H05K 7/10* (2006.01)
  *H01L 23/00* (2006.01)
  *H01L 23/498* (2006.01)
  *H01L 23/29* (2006.01)
  *H01L 23/31* (2006.01)
  *H01L 21/56* (2006.01)

(52) U.S. Cl.
  CPC ............ *H01L 2224/131* (2013.01); *H01L 2224/13023* (2013.01); *H01L 2224/13082* (2013.01); *H01L 2224/13144* (2013.01); *H01L 2224/13147* (2013.01); *H01L 2224/16237* (2013.01); *H01L 2224/73204* (2013.01); *H01L 2224/81815* (2013.01); *H01L 2224/83102* (2013.01); *H01L 2924/3512* (2013.01)

(56) References Cited

U.S. PATENT DOCUMENTS

| | | | |
|---|---|---|---|
| 8,228,682 B1* | 7/2012 | Zohni | H01G 2/065 257/734 |
| 9,673,065 B2* | 6/2017 | Williamson | H01L 23/562 |
| 2005/0252682 A1* | 11/2005 | Shimoto | H01L 21/4857 174/260 |
| 2006/0278999 A1* | 12/2006 | Hsu | H01L 24/11 257/778 |
| 2009/0289360 A1* | 11/2009 | Takahashi | H01L 23/49811 257/737 |
| 2013/0010432 A1 | 1/2013 | Sundstrom et al. | |

* cited by examiner

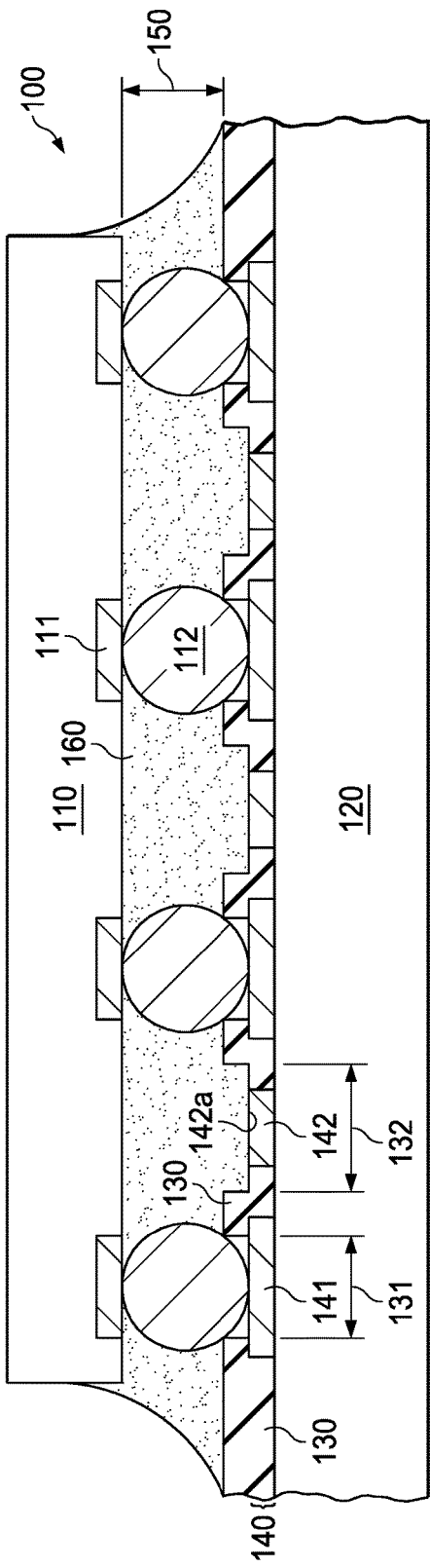
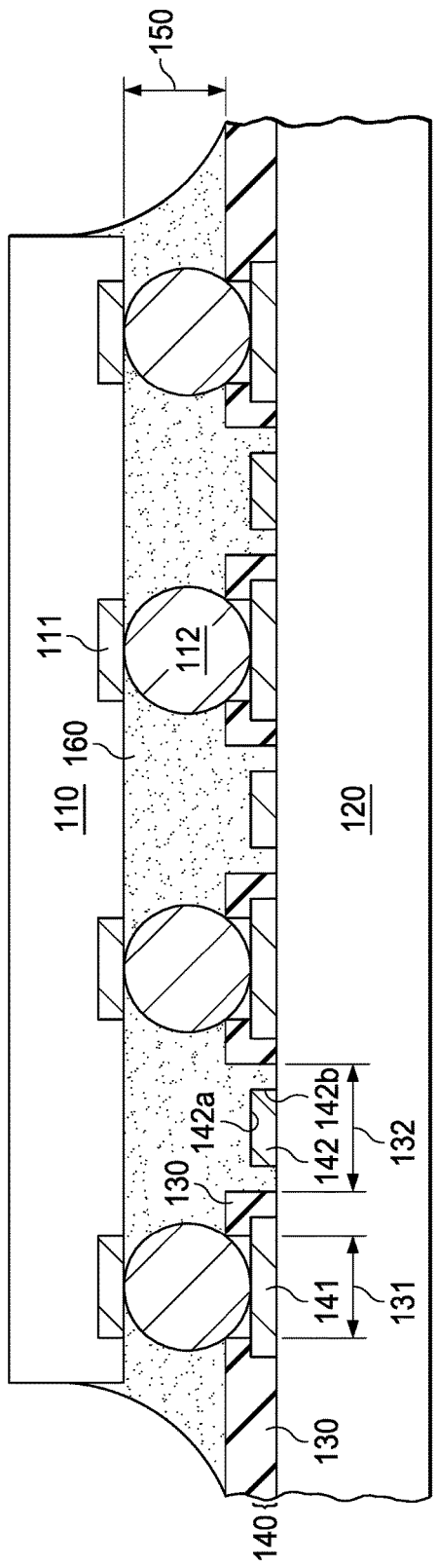
FIG. 1A
FIG. 1B

TABLE 1

| MATERIAL PROPERTY | FIRST INSULATING COMPOUND | SECOND INSULATING COMPOUND |
|---|---|---|
| Tg(TMA) | 102°C | 120 |
| MODULUS (GPa) | 2.7 | 10.7 |
| CTE (ppm/°C) | 55 | 29 |
| CTE (ppm/°C) | 140 | 100 |
| TENSILE STRENGTH (MPa) | 48 | 102 |
| ELONGATION % | 3.6 | 1.9 |

SEMICONDUCTOR SUBSTRATE HAVING STRESS-ABSORBING SURFACE LAYER

CROSS REFERENCE SECTION

This application is a Divisional of and claims priority to U.S. patent application Ser. No. 14/333,553 filed Jul. 17, 2014, which claims the benefit of the filing date of U.S. Provisional Application No. 61/847,631, filed on Jul. 18, 2013, the disclosures of which are hereby incorporated by reference herein in its entirety.

FIELD

Embodiments of the invention are related in general to the field of semiconductor devices and processes, and more specifically to the structure and fabrication method of semiconductor packages with hybrid solder masks capable of arresting nascent cracks in laminate traces.

DESCRIPTION OF RELATED ART

In semiconductor devices referred to as flip chip devices, terminals of semiconductor chips are attached to substrate pads with arrays of solder balls, or bumps, rather than the traditional metal wires. The number of the resulting input/output terminals may vary from only a handful—for which conventional metallic leadframes are preferred as substrates—to several hundred, for which laminated substrates are preferred. The laminated substrates are made of a vertical hierarchy of insulating layers alternating layers of patterned metal traces, which can interconnect from layer to layer with conductive vias through the insulators.

Similarly, in semiconductor devices referred to as ball grid array devices, terminals of packaged semiconductor chips are attached to substrate pads with arrays of solder balls, or bumps, rather than the traditional metal pins. It has been known since the introduction of these assembly techniques that the solder connections may come under severe thermomechanical stress due to the large differences of coefficients of thermal expansion (CTE) between semiconductor materials, such as silicon, and plastic materials, such as packages and substrates, and metals, such as copper.

It is common practice to test the reliability of the solder connections by subjecting the assembled semiconductor devices to temperature cycles, where the assembled packages are subjected to rapid temperature swings between −55° C. and +125° C. It has been shown that these temperature swings subject the assemblies to both compressive and tensile stresses and may lead to metal fatigue and eventual cracks at the joints.

When applicants analyzed failures occurring in reliability temperature cycling tests of semiconductor devices attached to laminated substrates by solder bumps, they found that the patterned traces of the top metal layer of the substrate have a propensity to crack and thus fail due to electrical open. The analysis of failures revealed that stresses due to package warpage and high stress concentrations at the package corners are transferred to the top substrate layer and then transmitted through the top insulating layer to the underlying conductive traces. After repeated cycles, the thin metallization layer of the traces succumbs to the stresses, then develops microcracks, and finally cracks open.

Applicants solved the cracking problem when they discovered a methodology to reduce the stresses by about 25%, when the substrate top insulation layer of a first insulating compound is transformed into a composite aggregate, in which areas of the first insulating compound alternate with areas of a second insulating compound and the second compound has a higher glass transition temperature $T_g$, a higher modulus, and a lower coefficient of thermal expansion (CTE) than the first compound.

As applicants found, the composite aggregate can be achieved by creating openings in the top insulating layer of the first insulating compound so that the surface of the underlying conductive traces is exposed, or alternatively, the surface and the sidewalls of the underlying traces are exposed. The openings are then filled with a second insulating compound touching the traces, wherein the second insulating compound has a higher glass transition temperature $T_g$, a higher modulus, and a lower coefficient of thermal expansion (CTE) than the first compound.

Alternatively, the openings in the first insulating compound are filled, together with the gap between the device and the substrate created by the solder ball assembly, with the underfill compound, which has a higher $T_g$, higher modulus, and lower CTE than the first insulating compound.

BRIEF DESCRIPTION OF THE DRAWINGS

FIG. 1A shows a cross section of an embodiment where the underfill compound touches the surface of the routing traces.

FIG. 1B depicts a cross section of another embodiment where the underfill compound touches the surface and the sidewalls of the routing traces.

DETAILED DESCRIPTION OF THE PREFERRED EMBODIMENTS

Figure 2:
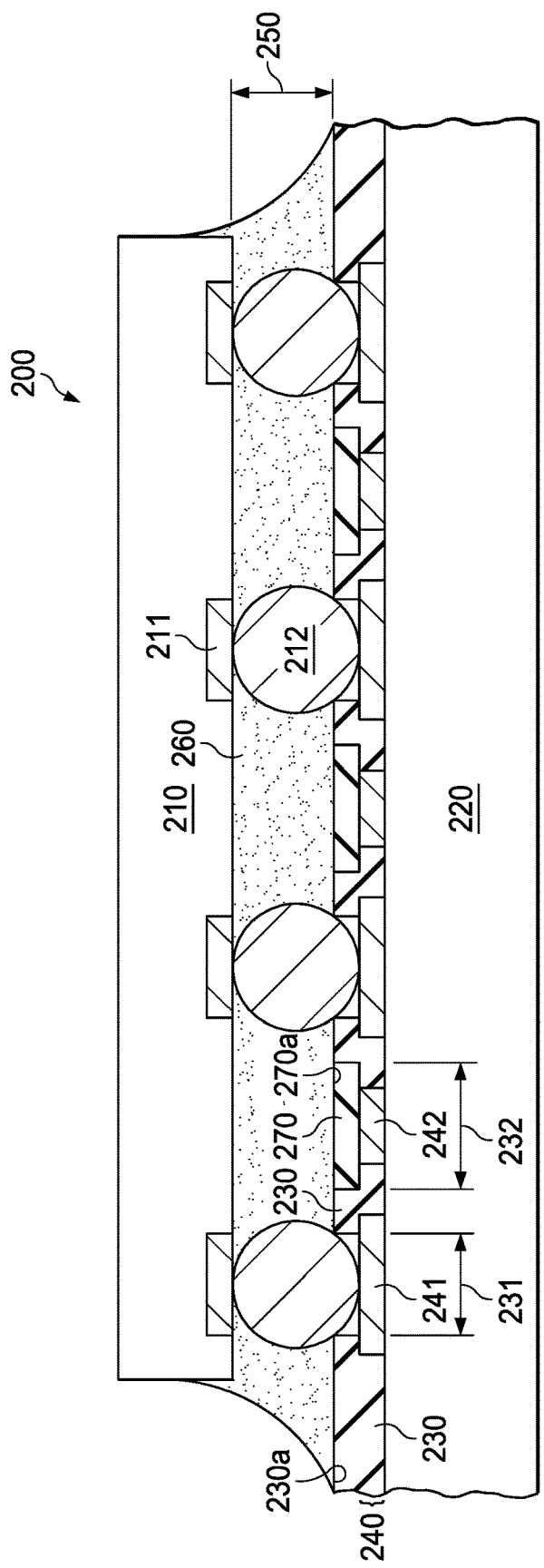
FIG. 2 a cross section of yet another embodiment where a stress-absorbing compound fills the recess of the solder mask to the routing traces

FIG. 1A shows a semiconductor assembly 100 as an exemplary embodiment of the invention; another embodiments 101 is displayed in FIG. 1B, and yet another embodiment 200 in FIG. 2. Assembly 100 includes a semiconductor device 110 attached to a substrate 120. Devices 110 may be packaged semiconductor products, or they may be semiconductor chips having an active surface such as an integrated circuit. Devices 110 include a plurality of terminals 111, which have a metallurgy suitable for solder attachment. Terminals 111 include metal bumps 112, which are also solderable. Exemplary FIGS. 1A and 1B depict the metal bumps 112 as solder balls; in other devices, the metal bumps may include copper pillars with solder caps, or, in still other examples, squashed copper or gold balls as created in wire bonding processes, also in combination with solder caps.

Substrate 120 is flat and rigid so that substrate warpage during usage and testing of the assembly is minimized. Substrate 120 may comprise a composite board with a plurality of laminated alternatingly conductive and insulating films. The conductive films are patterned in horizontal interconnecting traces, and the insulating films have conductive vertical vias. Alternatively, substrate 120 may be a carrier such as an insulating stiff board.

In the exemplary embodiment, substrate 120 includes a top layer 130 of a first insulating compound. A preferred thickness range for layer 130 is about 14 to 30 µm. As an example, first insulating compound is a polymeric and filler-filled material commonly known as solder mask or solder resist. The Table in FIG. 3 compiles a few material properties of an exemplary solder resist compound as follows (approximate numbers): A glass transition temperature ($T_g$) of 102° C., a modulus of 2.7 GPa, a coefficient of thermal expansion (CTE) of 55 ppm/° C. before reaching $T_g$, and a CTE of 140 ppm/° C. after reaching $T_g$, a tensile strength of 48 MPa, and a capability for elongation of 3.6%. These material characteristics are interrelated; for instance, a higher $T_g$ and a higher modulus are related to a lower CTE. A guiding fact in the selection of proper materials is the discrepancy of about a factor of 10 or more between the low CTE of silicon and the higher CTE of plastics and metals. As for the elongation, it is a parameter expressing how much an outside force, applied along the length of a lead, can stretch the lead in the direction of the length, while the dimension of the width is only slightly reduced so that the new shape appears elongated. For elongations small compared to the length, and up to a limit called the elastic limit given by the material characteristics, the amount of elongation is linearly proportional to the force. Beyond that elastic limit, the lead suffers irreversible changes and damage to its inner strength and will eventually break.

Covering a wider range of materials, the first insulating compound preferably is a rigid polymer having a modulus typically in the range of 2 to 6 GPa at room temperature and a CTE in the range of 40 to 70 ppm/° C. below the glass transition temperature of the material, and the second insulating compound is an epoxy-based polymer containing an inorganic filler material and having a modulus typically in the range of 6 to 11 GPa at room temperature and a CTE in the range of 20 to 40 ppm/° C. below the glass transition temperature.

In FIGS. 1A and 1B, right underneath and touching insulating top layer 130 is metal layer 140. Relative to insulating substrate 120, metal layer 140 represents the topmost conductive layer. A preferred thickness range for layer 140 is between about 10 and 20 µm. Preferred metals for layer 140 are copper and copper alloys; alternatively, layer 140 may be aluminum. As FIGS. 1A and 1B show, layer 140 is patterned in contact pads 141 and connecting traces 142.

As FIGS. 1A and 1B illustrate, insulating layer 130 has first openings 131 to expose underlying contact pads 141, and second openings 132 to expose underlying connecting traces 142. In the embodiment of FIG. 1A, second openings 132 expose the surface 142a of the underlying connecting traces 142. In the embodiment of FIG. 1B, second openings 132 expose the surface 142a and the sidewalls 142b of the underlying connecting traces 142.

It should be pointed out that this methodology of forming a stress-absorbing hybrid insulating layer can be applied repeatedly. Numerous consecutive and contiguous zones can be created including a first and a second insulating material, wherein one material has a higher $T_g$, a higher modulus, and a lower CTE than the other material.

In contrast to FIGS. 1A and 1B, the second openings 132 do not exist in present technology; rather, solder mask layer 130 has a flat surface between the first openings so that traces 142 are covered with first insulating compound.

As shown in FIGS. 1A and 1B, device 110 is assembled on the substrate by soldering the device bumps 112 through first openings 131 onto the contact pads 141. In this attachment process, a gap 150 is created between the underside of device 110 and the top surface of the top insulating layer 130. For the assemblies shown in the figures, it is preferred that gap 150 is about 50 to 100 µm high; in other devices, gap 150 may be shorter or higher. The actual width of gap 150 depends on the surface contours of chip 110 and substrate 120.

In a process based on capillary action and frequently called underfiling process, gap 150 is cohesively filled with a second insulating compound 160, which touches and preferably adheres to the metallic, semiconductor, and insulating surfaces facing gap 150. Consequently, compound 160 touches and preferably adheres to the surfaces 142a of the connecting traces 142 in FIG. 1A, or touches and preferably adheres to the surfaces 142a and sidewalls 142b of the connecting traces 142 in FIG. 1B.

The second insulating compound 160 has a higher glass transition temperature ($T_g$), a higher modulus, and a lower coefficient of thermal expansion (CTE) than the first insulating compound employed for layer 130. Table 1 in FIG. 3 compiles a few material properties of an exemplary second insulating compound as follows (approximate numbers): A glass transition temperature ($T_g$) of 120° C., a modulus of 10.7 GPa, a coefficient of thermal expansion (CTE) of 29 ppm/° C. before reaching $T_g$, and a CTE of 100 ppm/° C. after reaching $T_g$, a tensile strength of about 102 MPa, and a capability for elongation of 1.9%. As with the first insulating compound, these material characteristics are interrelated; for instance, a higher $T_g$ and a higher modulus are related to a lower CTE. As a comparison with the materials characteristics of the first compound shows (see the Table of FIG. 3), the CTE before $T_g$ of the second compound is less than a factor of 10 higher than the CTE of silicon. Consequently, the second insulating compound expands and contracts considerably less and thus creates much less thermomechanical stress than the first insulating compound, and is furthermore able to absorb thermomechanical stress to such extent that cracking of solder mask and of metallic parts (such as Interconnecting traces, solder joints, adhering parts) can be prevented.

Figures 3, 4:
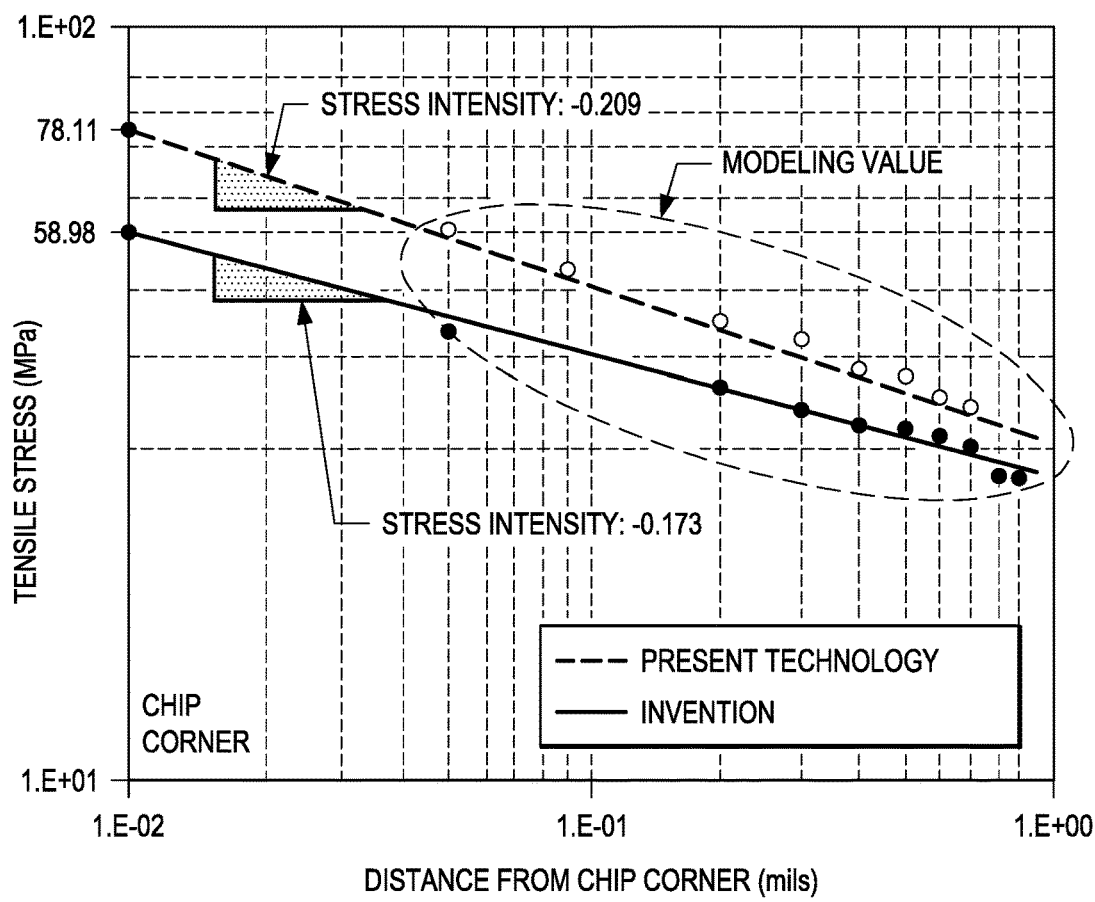
FIG. 3 shows a Table with examples of typical materials properties of insulating compounds used in semiconductor device assembly.
FIG. 4 is a plot of tensile stress at packaged semiconductor chips as a function of distance from the chip corner, showing the effect of stress-absorbing compounds.

FIG. 4 displays modeling data confirming the stress reduction effect of the second insulating compound and the significant enhancement of this effect by covering traces 142 with second insulating compound so that traces 142 are confronted with much reduced stress levels. As an indicator of the stress intensity, the double-logarithmic plot of FIG. 4 shows the tensile stress (in MPa) as a function of the distance (in mm) from the corner of chip 110. The tensile stress is determined at the copper trace 142. The modeling data interpolation is extrapolated to the chip corner, where the stress has a maximum value. The stress data is compared between device assemblies where the substrate does include (invention) solder mask openings 132 filled with the second insulating compound to the traces 142 (FIGS. 1A and 1B), and where the substrate has just solder mask instead of openings 132.

As the modeling data show, the stress intensity can be interpolated to follow straight lines of different slopes. When extrapolated to the chip corner, the data indicate that the second insulating compound, filling in opening 142, reduces the tensile stress at the copper traces by about 25%. This reduction is sufficient to prevent the appearance of microcracks in traces 142 and thus to prevent openings in metallic traces.

FIG. 2 depicts another embodiment 200 comprising a semiconductor assembly. A semiconductor device 210 has terminals 211 with solderable metal bumps 212. A flat substrate 220 includes a top layer 230 of a first insulating compound and an underlying metal layer 240 patterned in contact pads 241 and connecting traces 242. The insulating layer 230 includes first openings 231 to expose underlying contact pads 241 and second openings 232 to expose underlying connecting traces 242.

As FIG. 2 illustrates, second openings 232 are filled with a third insulating compound 270 so that the surface 270a of the fill material 270 is coplanar with the surface 230a of top layer 230 of the first insulating compound. The openings 232 in the solder mask 230 are filled in with a third insulating compound 270, before substrate 220 is used for the assembly of device 200 and before underfill compound 260 is applied. The third insulating compound 270 has a higher glass transition temperature ($T_g$), a higher modulus, and a lower coefficient of thermal expansion (CTE) than the first insulating compound 230. Preferably, third insulating compound 270 has a higher glass transition temperature ($T_g$), a higher modulus, and a lower coefficient of thermal expansion (CTE) than the second insulating compound 260 used for the underfill process described below.

Device 210 is assembled on substrate 220 by a solder reflow process, wherein the device bumps 212 are soldered through the first openings 231 onto the contact pads 242. By this reflow attachment process, a gap 250 is established between the device 210 and the top insulating layer 230.

In the so-called underfill process based on capillary force, a second insulating compound 260 fills gap 250, the second insulating compound having a higher glass transition temperature ($T_g$), a higher modulus, and a lower coefficient of thermal expansion (CTE) than the first insulating compound 230.

Figure 5A:
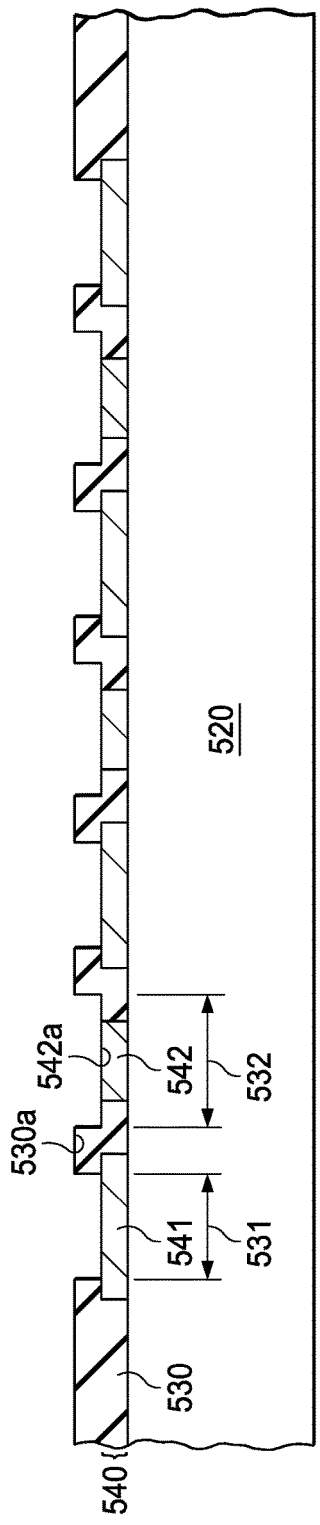
FIG. 5A illustrates a cross section of a substrate for semiconductor devices having a surface layer of a first insulating compound with openings to expose the surface of underlying conductive traces.
Figure 5B:
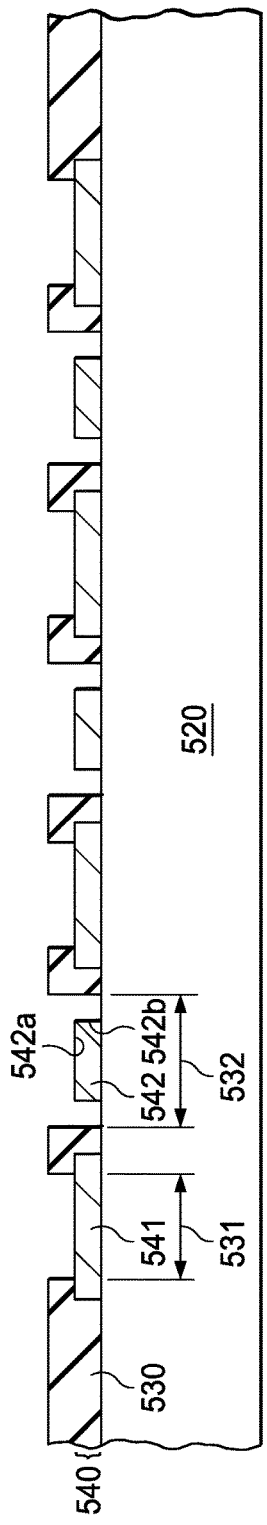
FIG. 5B shows a cross section of a substrate for semiconductor devices having a surface layer of a first insulating compound with openings to expose the surface and the sidewalls of underlying conductive traces.
Figure 5C:
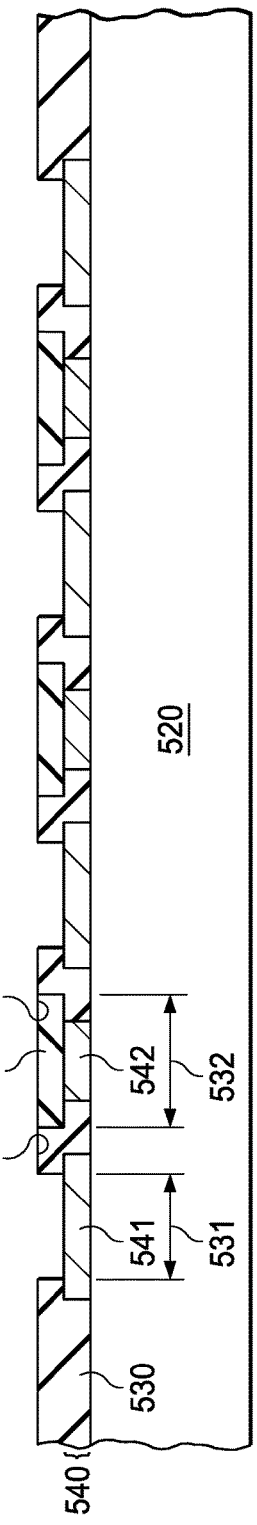
FIG. 5C illustrates a cross section of a substrate for semiconductor devices having a surface layer of a first insulating compound with openings to expose the surface of underlying conductive traces, the openings filled with a stress-absorbing second insulating compound.

Another embodiment of the invention is a substrate for use in semiconductor devices. Exemplary substrates are depicted in FIGS. 5A, 5B, and 5C. Substrate 520 is flat and rigid so that substrate warpage during usage and testing of the assembly is minimized. Substrate 520 may comprise a composite body with a plurality of laminated areas of alternatingly conductive and insulating films. The conductive films are patterned in horizontal interconnecting traces, and the insulating films have conductive vertical vias. Alternatively, substrate 520 may be a carrier such as an insulating stiff board.

In either case, flat body 520 has a top layer 530 of a first insulating compound with a surface 530a, and an underlying metal layer 540 patterned in contact pads 541 and connecting traces 542. The first insulating compound may be a polymeric compound filled with an inorganic filler to provide mechanical strength and lower CTE; a preferred compound is the so-called solder mask or solder resist. Preferred metals of layer 540 are copper or a copper alloy due to their high electrical conductivity. Alternatively, layer 540 may include silver and aluminum.

Top insulating layer 530 has first openings 531 to expose underlying contact pads 541 and second openings 532 to expose underlying connecting traces 542. In FIG. 5A, the underlying traces 542 are exposed so that the surface 542a of the traces is exposed. In FIG. 5B, the underlying traces 542 are exposed so that the surface 542a and the sidewalls 542b of the traces are exposed.

In FIG. 5C, the second openings 532 are filled with a third insulating compound with a higher glass transition temperature ($T_g$), a higher modulus, and a lower coefficient of thermal expansion (CTE) than the first insulating compound 530. As FIG. 5C shows, third insulating compound 570 is in touch with the underlying connecting traces 542. Furthermore, the surface 570a of the filled second openings are coplanar with the surface 530a of the first insulating layer.

The substrate of FIG. 5C has a hybrid stress-absorbing surface layer and acts as a substrate with a hybrid solder mask capable of arresting nascent cracks in laminate traces and thus preventing failures in operations and tests generating thermomechanical stresses.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention is applicable for substrates for any semiconductor flip-chip or ball grid array device, including silicon germanium and III-V compound semiconductors.

As another example, the invention is applicable for any assembly using metals (such as copper pillars and gold bumps) for interconnecting and spacing devices on substrates, and where CTE differences cause thermomechanical stresses. As another example, the invention applies where hybrid insulating layers composed areas of different $T_g$, modulus, and CTE may be used as stress-absorbing layers incorporated even inside of substrates.

It is therefore intended that the appended claims encompass any such modifications or embodiments.

We claim:

1. A semiconductor assembly comprising:
   a semiconductor device having terminals with solderable metal bumps;
   a flat substrate having a top layer of a first insulating compound and an underlying metal layer patterned in contact pads and connecting traces, the insulating layer having first openings to expose underlying contact pads and second openings to expose underlying connecting traces;
   the device assembled on the substrate wherein the device bumps are soldered through only the first openings onto the contact pads, the device bumps are not soldered through the second openings, the device bumps establishing a gap between the device and the top insulating layer; and
   a second insulating compound cohesively filling the gap and the second openings, thereby touching the underlying connecting traces, the second insulating compound having a higher glass transition temperature ($T_g$), a higher modulus, and a lower coefficient of thermal expansion (CTE) than the first insulating compound.

2. The assembly of claim 1 wherein the first insulating compound is a rigid polymer having a modulus typically in the range of 2 to 6 GPa at room temperature and a CTE in the range of 40 to 70 ppm/° C. below the glass transition temperature of the material, and the second insulating compound is an epoxy-based polymer containing an inorganic filler material and having a modulus typically in the range of 6 to 11 GPa at room temperature and a CTE in the range of 20 to 40 ppm/° C. below the glass transition temperature.

3. The assembly of claim 1 wherein the second openings expose the surface of the underlying connecting traces.

4. The assembly of claim 3 wherein the second openings include more than one opening for each connecting trace.

5. The assembly of claim 1 wherein the second openings expose the surface and the sidewalls of the underlying connecting traces.

6. The assembly of claim 1 wherein the semiconductor device is a semiconductor chip.

7. A semiconductor assembly comprising:
a semiconductor device having terminals with solderable metal bumps;
a flat substrate having a top layer of a first insulating compound and an underlying metal layer patterned in contact pads and connecting traces, the insulating layer having a surface with first openings to expose underlying contact pads and second openings to expose underlying connecting traces;
a third insulating compound filling the second openings, the third insulating compound having a higher glass transition temperature ($T_g$), a higher modulus, and a lower coefficient of thermal expansion (CTE) than the first insulating compound, the surface of the filled opening coplanar with the surface of the first insulating layer;
the device assembled on the substrate wherein the device bumps are soldered through the first openings onto the contact pads, thereby establishing a gap between the device and the top insulating layer; and
a second insulating compound cohesively filling the gap except the second openings, the second insulating compound has a higher $T_g$, a higher modulus, and a lower CTE than the first insulating compound.

8. The assembly of claim 7 wherein the third insulating compound has a higher $T_g$, a higher modulus, and a lower CTE than the second compound.

9. A substrate for use in semiconductor devices comprising:
a flat body having a first layer of a first insulating compound, and an underlying metal layer patterned in contact pads and connecting traces, the first insulating layer having first openings to expose only underlying contact pads and second openings to expose underlying connecting traces.

10. The substrate of claim 9 wherein the second openings expose the surface of the underlying connecting traces.

11. The assembly of claim 9 wherein the second openings expose the surface and the sidewalls of the underlying connecting traces.

12. The substrate of claim 9 wherein the second openings are filled with a third insulating compound having a higher glass transition temperature ($T_g$), a higher modulus, and a lower coefficient of thermal expansion (CTE) than the first insulating compound, the third insulating compound in touch with the underlying connecting traces.

13. The substrate of claim 12 wherein the surface of the filled second openings are coplanar with the surface of the first insulating layer.

* * * * *